(12) United States Patent
Mun et al.

(10) Patent No.: US 10,510,831 B2
(45) Date of Patent: Dec. 17, 2019

(54) LOW ON RESISTANCE HIGH VOLTAGE METAL OXIDE SEMICONDUCTOR TRANSISTOR

(71) Applicant: GLOBALFOUNDRIES Singapore Pte. Ltd., Singapore (SG)

(72) Inventors: Namchil Mun, Singapore (SG); Jeoung Mo Koo, Singapore (SG); Shiang Yang Ong, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 29 days.

(21) Appl. No.: 15/898,671

(22) Filed: Feb. 19, 2018

(65) Prior Publication Data
US 2019/0259829 A1     Aug. 22, 2019

(51) Int. Cl.
| | |
|---|---|
| *H01L 29/78* | (2006.01) |
| *H01L 29/06* | (2006.01) |
| *H01L 29/40* | (2006.01) |
| *H01L 29/66* | (2006.01) |
| *H01L 29/423* | (2006.01) |
| *H01L 29/51* | (2006.01) |
| *H01L 29/08* | (2006.01) |
| *H01L 29/417* | (2006.01) |
| *H01L 29/49* | (2006.01) |

(52) U.S. Cl.
CPC ...... *H01L 29/0634* (2013.01); *H01L 29/0847* (2013.01); *H01L 29/402* (2013.01); *H01L 29/41775* (2013.01); *H01L 29/42376* (2013.01); *H01L 29/4933* (2013.01); *H01L 29/517* (2013.01); *H01L 29/66522* (2013.01); *H01L 29/66613* (2013.01); *H01L 29/66636* (2013.01); *H01L 29/7813* (2013.01); *H01L 29/7816* (2013.01)

(58) Field of Classification Search
CPC ............ H01L 29/0688; H01L 29/0692; H01L 29/0886; H01L 29/0882; H01L 29/7833
See application file for complete search history.

(56) References Cited

U.S. PATENT DOCUMENTS

| | | | |
|---|---|---|---|
| 2014/0203358 A1* | 7/2014 | Yang | ................... H01L 29/7835 257/335 |
| 2015/0270333 A1* | 9/2015 | Yang | ..................... H01L 29/063 257/337 |

* cited by examiner

*Primary Examiner* — Hoang-Quan T Ho
*Assistant Examiner* — Scott Stowe
(74) *Attorney, Agent, or Firm* — Thompson Hine LLP; Anthony Canale (57) ABSTRACT

A high voltage transistor with low on resistance is disclosed. The transistor may include at least one cut out region in the drift region under the drain of the transistor. The cut out region is devoid of the drift well which connects the drain to the channel. Cut out regions may be distributed along the width direction of the drain region of the transistor. The transistor may alternatively or further include a vertical polysilicon plate surrounding the device region. The vertical polysilicon plate may be implemented as a deep trench isolation region. The deep trench isolation region includes a deep trench lined with an insulation collar and filled with polysilicon. The vertical polysilicon plate reduces an on resistance to improve device performance.

16 Claims, 10 Drawing Sheets

LOW ON RESISTANCE HIGH VOLTAGE METAL OXIDE SEMICONDUCTOR TRANSISTOR

TECHNICAL FIELD

The present disclosure generally relates to semiconductor devices. In particular, the disclosure relates to a reduced surface field (RESURF) structure with a resistive path in the drain region for high voltage power switching applications.

BACKGROUND

High voltage (HV) transistors, such as n-type lateral diffused metal oxide semiconductor (nLDMOS) transistors, have various applications, such as for automotive integrated circuits (ICs) and power ICs. The HV transistors operate, for example, at 85 V or greater. Such HV transistors employ reduced surface field (RESURF) techniques. Conventional RESURF techniques require the use of a thick surface epitaxial layer, such as greater than 10 μm. However, the use of a thick epitaxial layer creates problems. For example, thick epitaxial layer results in weak junction isolation, which can cause reliability issues. In addition, the use of a thick epitaxial layer produces high on resistance, negatively impacting device performance.

The present disclosure is directed to reliable HV transistors with reduced on resistance to improve performance.

SUMMARY

Embodiments of the present disclosure generally relate to a semiconductor device and method for forming the semiconductor device. In one embodiment, a device is disclosed. The device includes a substrate with a device region. A transistor is provided in the device region. The transistor includes a gate with first and second gate sidewalls on the substrate, a first source/drain (S/D) region adjacent to the first gate sidewall and a second S/D region adjacent to the second gate sidewall. A body well is also disposed in the device region which encompasses the second S/D region and extends under a portion of the gate beyond the second gate sidewall. A drift well is disposed in the substrate. The drift well includes a non-cut out region disposed under a first portion of the first S/D region and a cut out region disposed under a second portion of the first S/D region. The non-cut out region extends under the gate to the body well and couples the first S/D region to the body well. As for the cut out region, it is devoid of the drift well and is structured to reduce an on resistance of the transistor.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to semiconductor devices or integrated circuits (ICs). More particularly, embodiments relate to high power devices. For example, high voltage (HV) or high power devices include lateral drain-diffused (LD) transistors, such as lateral drain-diffused metal oxide semiconductor (LDMOS) transistors. The high power devices can be employed as switching voltage regulators for power management applications. The LD transistors can be easily integrated into devices or ICs. The devices or ICs can be incorporated into or used with, for example, various types of products.

The fabrication of devices may involve the formation of features on a substrate that makes up circuit components, such as transistors. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel.

Figure 1:
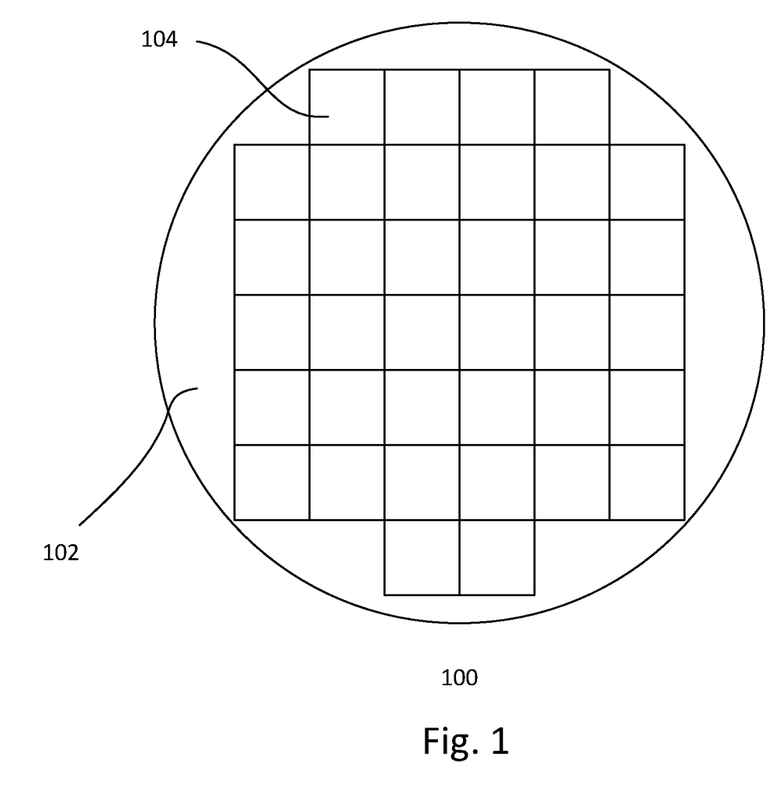
FIG. 1 shows a top view of a semiconductor wafer.

FIG. 1 shows a simplified plan view of an embodiment of a semiconductor wafer 100. The semiconductor wafer, for example, may be a silicon wafer. The wafer includes an active surface 102 on which a plurality of devices 104 are formed in parallel. The devices, for example, are arranged in rows along a first (x) direction and columns along a second (y) direction. Separating the devices are dicing channels. After processing is completed, the wafer is diced along the dicing channels to singulate the devices into individual chips.

Figure 2A:
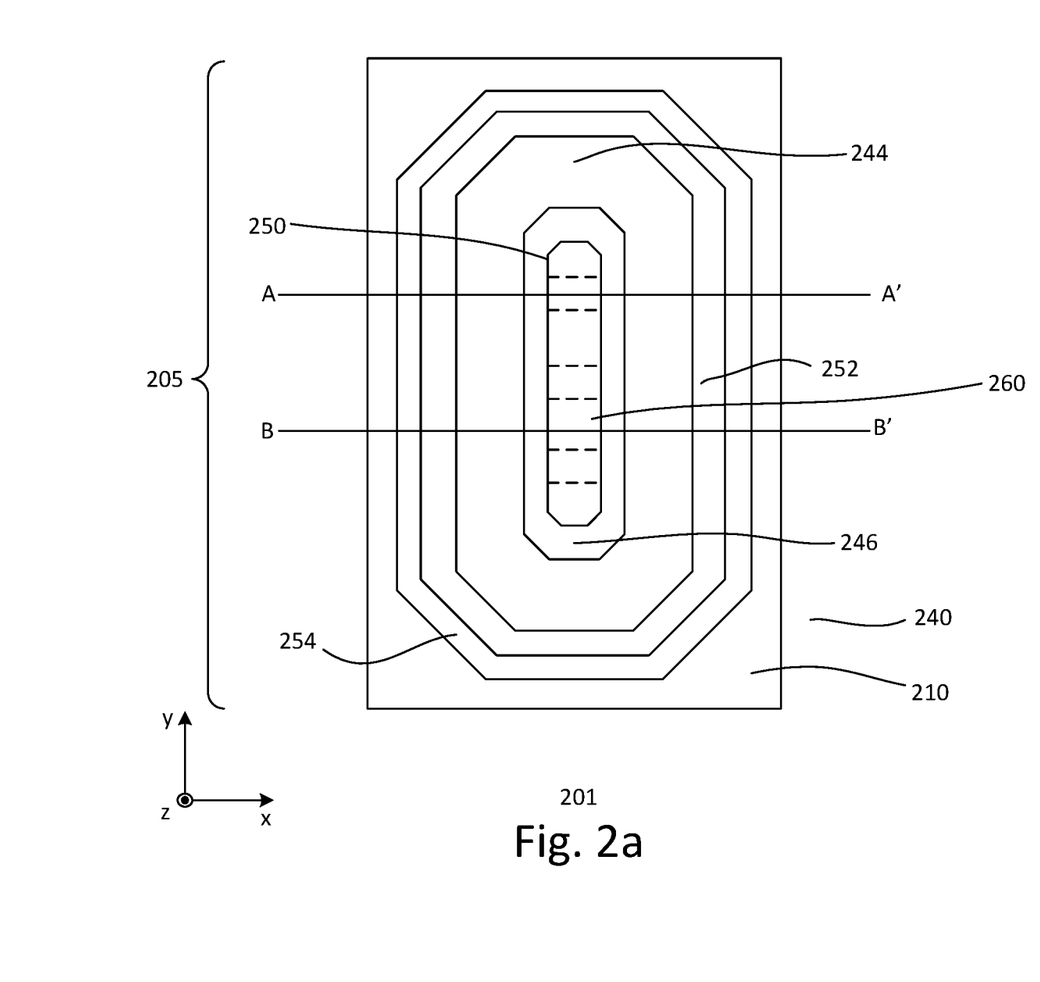
FIGS. 2a-2c show simplified top and cross-sectional views of an embodiment of a device.
Figure 2B:
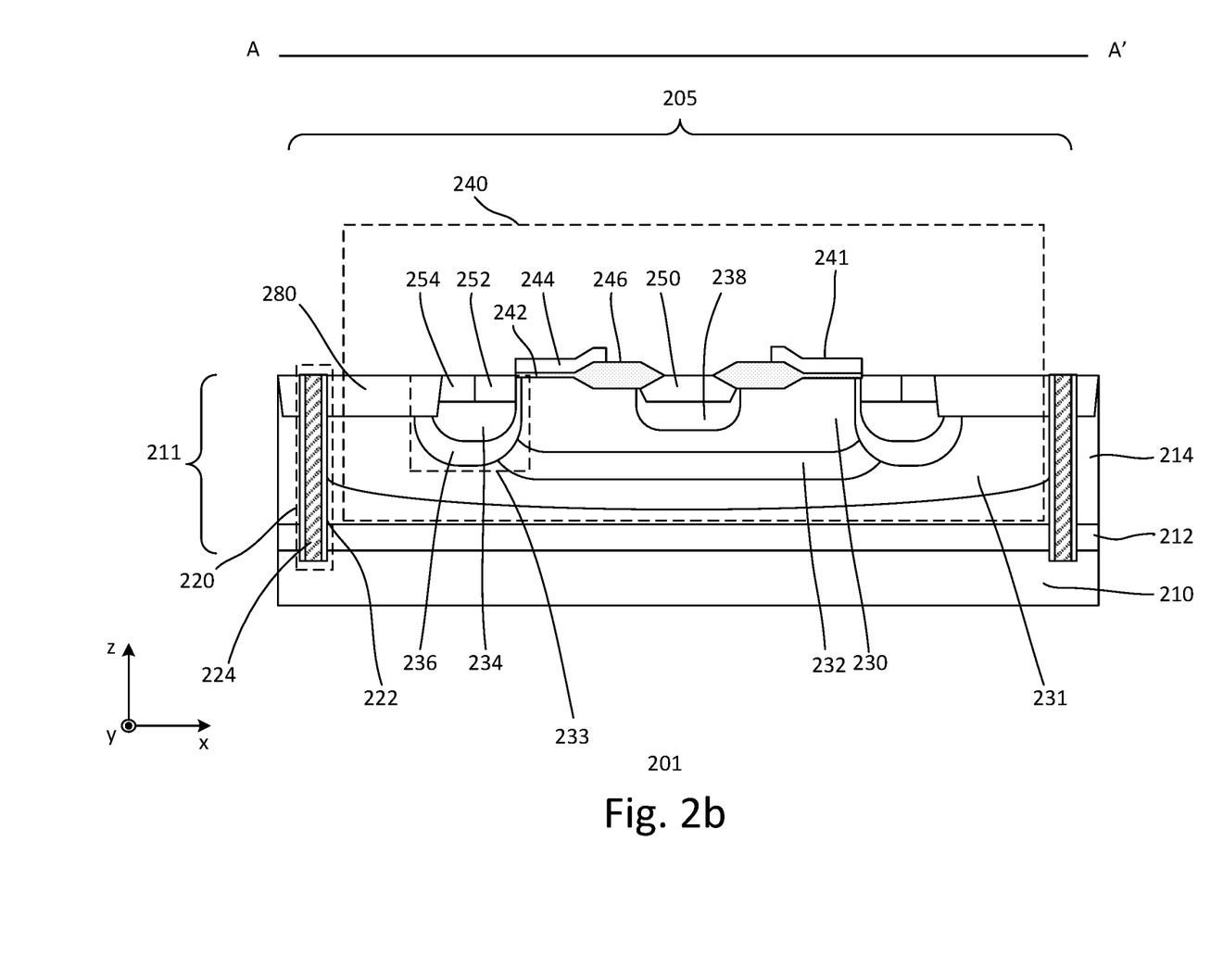
Figure 2C:
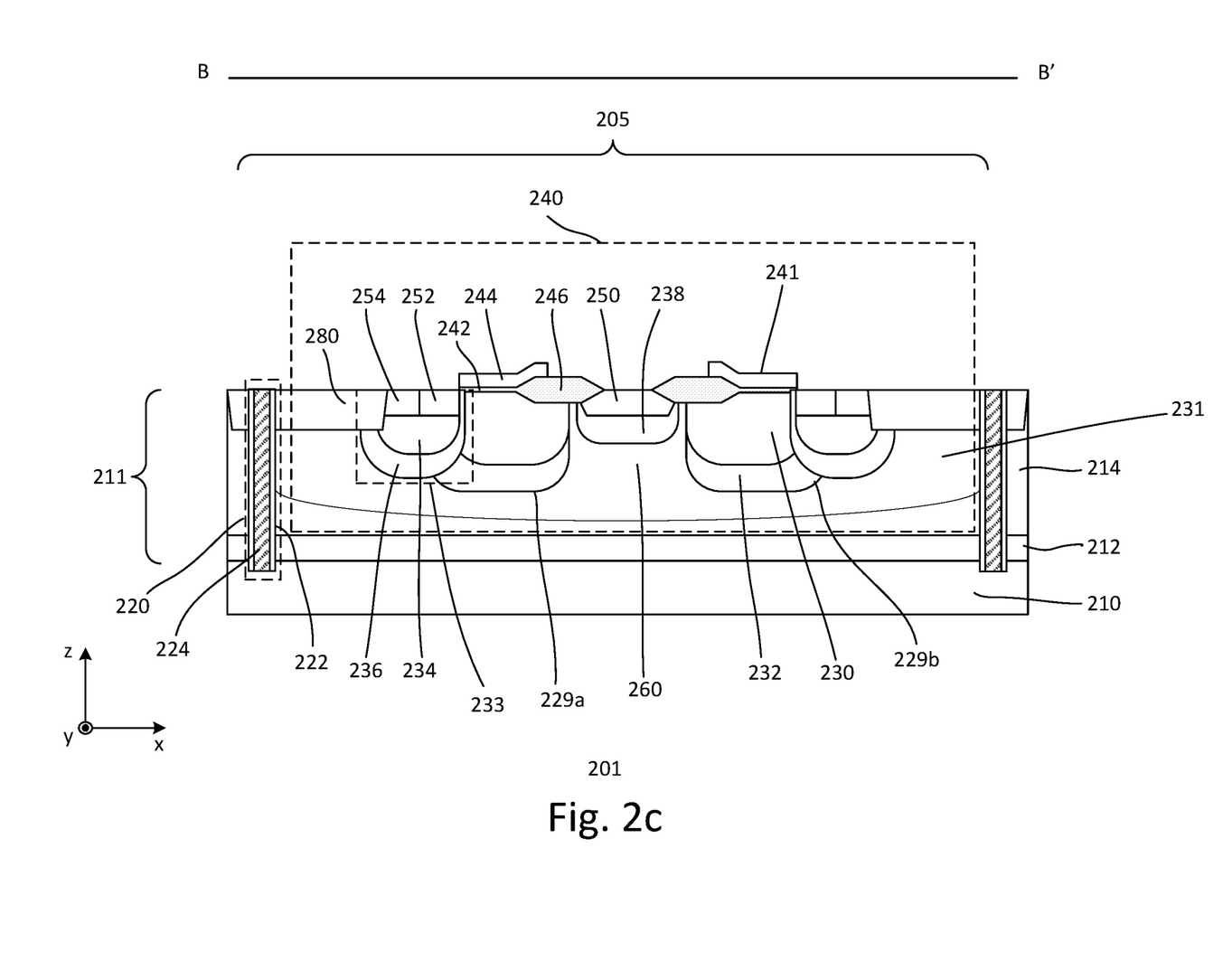

FIGS. 2a-2c show various views of an embodiment of a device 201. In particular, FIG. 2a shows a plan view of an embodiment of the device and FIGS. 2b-2c show cross-sectional views of the device across A-A' and B-B'. The cross-sectional views are along a first (x) direction. The x direction, for example, is along a channel length direction of the device.

Referring to FIGS. 2a-2c, the device may be an IC. Other types of devices may also be useful. As shown, the device includes a substrate 210. The substrate, for example, is a silicon substrate. Other suitable types of semiconductor substrates may also be useful. The substrate may be a doped substrate. For example, the substrate can be lightly doped with second polarity type dopants. The second polarity type dopants, for example, are p-type dopants. Providing a substrate with other types of dopants or dopant concentrations, as well as an undoped substrate may also be useful.

The device may include doped regions having different dopant concentrations and dopants. For example, the device may include heavily doped ($x^+$), intermediately doped ($x$)

and lightly doped (x) regions, where x is the polarity type which can be p or n. A lightly doped region may have a dopant concentration of about 1E11-1E13 dopants/cm$^3$, an intermediately doped region may have a dopant concentration of about 1E13-1E15 dopants/cm$^3$, and a heavily doped region may have a dopant concentration of about 1E15-1E17 dopants/cm$^3$. Providing other dopant concentrations for the differently doped regions may also be useful, for example, depending on the breakdown voltage requirement. P-type dopants may include boron (B), aluminum (Al), indium (In) or a combination thereof, while n-type dopants may include phosphorous (P), arsenic (As), antimony (Sb) or a combination thereof.

The substrate may include an epitaxial (epi) layer 211 disposed on the substrate. The epi layer, for example, is a silicon epitaxial layer grown on the surface of the substrate. The thickness of the epi layer may be about 10 µm. Providing an epi layer having other thicknesses may also be useful. In other embodiments, the substrate may be a bulk substrate. For example, no epi layer is provided over the substrate.

As shown, the epi layer includes a lower epi portion and an upper epi portion. The lower portion includes a buried isolation layer 212. In one embodiment, the buried isolation layer is a doped buried isolation layer. The doped buried isolation layer, in one embodiment, includes a first polarity type heavily doped buried isolation layer. For example, the buried isolation layer is a n-type heavily doped buried isolation layer. The dopant concentration of the buried isolation layer may be about 1E22-1E23 dopants/cm$^3$. Other dopant concentrations may also be useful. The buried isolation layer serves to isolate the upper portion of the epi layer from the substrate. For example, the N$^+$ buried layer isolates the upper portion of the epi layer from the p-type doped substrate. The thickness of the buried isolation layer may be about 4-6 µm. Other thicknesses may also be useful.

As for the upper portion, it serves as a device portion on which transistors or circuit components are formed. The upper portion includes a surface device layer 214. In one embodiment, the upper portion may be a lightly doped second polarity type upper portion. For example, the upper portion may be a lightly doped p-type upper portion. Other types of upper portions of the epi layer may also be useful. For example, a first polarity type upper portion, such as a n-type upper portion, may be employed. The thickness of the upper portion of the epi layer may be about 4-8 µm. Providing other thicknesses for the upper portion of the epi layer may also be useful. For example, different thickness ranges for the upper portion of the epi layer may depend on different operation voltages.

The doping of the buried isolation layer and the upper portion of the epi layer may be achieved by various techniques. For example, the portions may be doped by in-situ doping during epi growth, ion implantation after epi growth or a combination thereof.

In one embodiment, the substrate includes a device region 205. The device region may be a HV device region. In one embodiment, the device region includes a HV LD transistor 240. The HV LD transistor, for example, is capable of operating at 100-140 V. Operating at other voltage ranges for the HV transistor may also be useful. The substrate may include other device regions. For example, the substrate may include logic and/or memory regions. Providing device regions for low voltage and medium voltage devices may also be useful.

The substrate includes a device isolation region 280. For example, the epi layer includes a device isolation region. The device isolation region may be a shallow trench isolation (STI) region. A STI region includes an isolation trench filled with isolation or dielectric materials. Other types of device isolation regions may also be useful. The device isolation region isolates the device region from other regions on the substrate. In one embodiment, the isolation region surrounds the device region. The device region may have a rectangular shape having a length and a width. The length (x) direction, for example, is in a channel length direction and the width (y) direction is in a channel width direction. Other shaped device regions, such as octagonal shaped device regions may also be useful. The device isolation region extends from the surface of the epi layer to a depth which is shallower than the buried isolation layer. The depth, for example, may be about 0.3-0.5 µm. Other depths for the STI region may also be useful.

In one embodiment, a deep trench isolation region 220 is provided. The deep trench isolation, as shown, is disposed through the STI region and extends from the surface of the substrate to a depth below the bottom of the buried isolation layer. The deep trench isolation region, in one embodiment, surrounds the device region. In some cases, a plurality of deep trench isolation regions may be distributed through around the device region to provide isolation between devices. The deep trench isolation may serve as a junction isolation. For example, the deep trench isolation improves junction isolation in the epi layer.

The deep trench isolation region, in one embodiment, includes a dielectric collar 222 lining the sidewalls of the deep trench. The width of the deep trench may be about 1-3 µm. Other widths may also be useful. The dielectric collar, for example, is silicon oxide and is sufficiently thick to provide isolation. The thickness of the dielectric collar may be about 0.2-0.5 µm. Other thicknesses may also be useful. The trench, in one embodiment, is filled with polysilicon 224. The polysilicon fill may be a doped polysilicon fill. In one embodiment, the polysilicon fill is a doped polysilicon fill. The doped polysilicon fill may serve as a tap to the substrate below the buried isolation layer. For example, the deep trench is used to bias the substrate. The bias voltage, for example, may be ground. Biasing the substrate with other bias voltages may also be useful.

As shown, the deep trench isolation region provides junction isolation and serves as a substrate tap. In one embodiment, separate deep trench isolation regions may be provided for the junction isolation and substrate tap. For example, a first deep trench isolation region may be provided for junction isolation and a second deep trench isolation region may be provided surrounding the first deep trench isolation region to serve as the substrate tap. Other configurations of deep trench isolation regions may also be useful.

The device region includes a HV device well 231. The HV device well, in one embodiment, is a first polarity type deep device doped well for a first polarity type LD transistor. The dopant concentration of the HV device well may be about 1E16-1E17 dopants/cm$^3$. Other dopant concentrations may also be useful. The HV device doped well extends under the device isolation region and may have a depth of about 4-6 µm. Other depths may also be useful.

The surface of the substrate includes a top field oxide 246. The top field oxide, for example, is a thermal top field oxide. The top field oxide, in one embodiment, is a ring shaped top field oxide. As shown, the top field oxide includes an elongated octagonal shape. Providing an octagonal shaped top field oxide avoids 90° angle, which reduces electric field buildup at the corners. Other top field oxide shapes may also be useful.

The transistor includes a gate 241. The gate includes a gate electrode 244 disposed over a gate dielectric 242. The gate electrode may be polysilicon while the gate dielectric may be thermal silicon oxide. As for the gate electrode, it may be a doped gate electrode. For example, the gate electrode may be doped with first polarity type dopants. Other types of gate electrodes or dielectrics may also be useful. A thickness of the gate dielectric may be about 0.1-0.4 µm and the gate electrode may be about 0.1-0.2 µm.

In one embodiment, the gate is a ring shaped gate. Similar to the top field oxide, the gate includes an elongated octagonal shaped. The gate is disposed partially on the top field oxide and partially on the substrate surrounding the top field oxide. For example, the gate may include an overlapping portion which is disposed on the top field oxide and a non-overlapping portion disposed on the substrate. A first sidewall of the gate forms the inner sidewall of the ring shaped gate and a second sidewall of the gate forms the outer sidewall of the ring shaped gate. The gate oxide in the non-overlapping portion is disposed on the substrate, separating the substrate from the gate electrode. As for the overlapping portion, the gate dielectric may merge with the top field oxide. In other embodiments, providing a non-ring shaped gate may also be useful. For example, depending on the desired operation voltage, a gate with a top field oxide and a drift region for displacing the drain region may be used.

First and second S/D regions 250 and 252 are disposed in the substrate in the device region. For example, the S/D regions are disposed in the epi layer. The S/D regions are first polarity type doped regions for a first polarity type HV transistor. In one embodiment, the first polarity type is n-type for a n-type HV transistor. Providing p-type S/D regions may also be useful for p-type HV transistors. The S/D regions, in one embodiment, are heavily doped with first polarity type dopants. The dopant concentration of the S/D regions may be about 1E21 dopants/cm$^3$. Other dopant concentrations may also be useful. The first S/D region may serve as a drain terminal and the second S/D region may serve as a source terminal.

In one embodiment, the first S/D region 250 is disposed in the opening of the ring shaped top field oxide. The first S/D region is displaced from the first sidewall of the gate by the top field oxide. As for the second S/D region 252, it is disposed in the substrate adjacent to the second sidewall of the gate. For example, the second S/D surrounds the second sidewall of the ring shaped gate.

The first S/D region may include a lightly doped extension region. The lightly doped extension region, for example, extends under the gate while an offset spacer (not shown) on the second gate sidewall displaces the second S/D region away from the gate. An offset spacer may include an oxide spacer lining the sidewall and bottom of the substrate and a nitride spacer disposed on the oxide spacer. Other configurations of the offset spacers may also be useful. An offset spacer may also be provided on the first gate sidewall.

The substrate, as shown, includes various wells of the HV transistor. For example, the epi layer above the buried isolation layer includes various wells of the HV transistor. The wells include p-type and n-type wells with different dopant concentrations.

In one embodiment, a body well 233 is disposed in the substrate. For example, the body well may be disposed in the epi layer. The body well encompasses the second S/D or source region. The body well, for example, is a second polarity type body well. In one embodiment, the body well includes a first body well 234 and a second body well 236.

The first body well may be referred to as an upper body well and the second body well may be referred to as a lower body well. For example, the first body well encompasses the source region while the second body well encompasses the first body well. In one embodiment, the first body well is an intermediately doped second polarity type well. For example, the first body well has a dopant concentration of about 1E19 dopants/cm$^3$. Other dopant concentrations may also be useful. As shown, a depth of the first body well is deeper than the device isolation region. For example, the depth of the first body well may be about 2-4 µm. Providing the first body well having other depths may also be useful. The first body well 234 extends from under the device isolation region to about the second gate sidewall.

As for the second body well 236, it encompasses the first body well. The second body well 236 is a second polarity type well having a lighter dopant concentration than the first body well 234. The second body well may be a lightly doped second polarity type well with a concentration of about 1E16-1E17 dopants/cm$^3$. Other dopant concentrations may also be useful. As shown, a depth of the second body well 236 is deeper than the first body well 234. For example, the depth of the second body well may be about 4-5 µm. Providing the second body well having other depths may also be useful. The second body well 236 extends from under the device isolation region to under the gate. Other configurations of the body well or body wells may also be useful.

The channel length of the HV transistor, for example, is equal to the distance from the source to the edge of the second body well. For example, the amount which the second body well underlaps the gate is equal to the channel length. Typically, the channel length of the HV device may be about 0.5-1.5 µm. Providing a HV device with other channel lengths may also be useful. The channel length may be tailored by adjusting the amount that the second body well extends under the gate.

In one embodiment, a body tap or contact 254 is provided. The body tap is disposed adjacent to the source region. For example, the body tap 254 surrounds the source region. As shown, the body tap abuts the source region. Other configurations of the body tap may also be useful. For example, an internal STI region (not shown) may be provided between the device isolation region and the source region. The internal STI region, for example, surrounds the source region. The body tap, in one embodiment, is a second polarity type heavily doped region. In one embodiment, the body tap and the source region are commonly coupled. Other configurations of the body tap and the source region are also useful.

In one embodiment, a drain well 238 may be provided. The drain well encompasses the first S/D or drain region 250. The drain well is a first polarity type doped well. In one embodiment, the dopant concentration of the drain well 238 is lighter than the drain region. For example, the drain well may be an intermediately doped first polarity type well. The dopant concentration of the drain well may be about 1E18 dopants/cm$^3$. Other dopant concentrations may also be useful. As shown, the drain well 238 has a depth which is deeper than the device isolation region. For example, the depth of the drain well may be about 2-3 µm. Other depths for the drain well may also be useful. The drain well extends slightly under the top field oxide.

In one embodiment, a drift well 230 is provided. For example, the drift well is provided in the epi layer. The drift well is a first polarity type doped well having a lighter dopant concentration than the drain well. For example, the drift well 230 is a lightly doped first polarity type doped well. The dopant concentration of the drift well may be about 1E16-1E17 dopants/cm$^3$. Other dopant concentrations for the drift well may also be useful. In other embodiments, the drift well 230 may have a graded dopant profile, with heavier dopant concentration at the top and lighter dopant concentration at the bottom. The drift well 230 has a depth which is deeper than the drain well. The drift well may have a depth which is equal to about that of the first body well. For example, the depth of the drift well may be about 2-3 μm. Providing a drift well having other depths may also be useful. As shown in FIG. 2b, the drift well is disposed under the gate and abuts the second body well. In the non-cut out region, the drift well 230 encompasses the drain region 250 and drain well 238

A reduced surface field (RESURF) well 232 is provided in the device region. The RESURF well is a second polarity type doped well. The RESURF well 232 is disposed under the drift well, serving to reduce the on resistance while maintaining high voltages. The dopant concentration of the RESURF well may be about 1E16-1E17 dopants/cm$^3$. Other dopant concentrations for the RESURF well may also be useful. A depth of the RESURF well 232 may be about 4-5 μm. Other depths may also be useful.

The body well 233, drift well 230 and RESURF well 232 are disposed within the HV device well 231. The HV device well may be considered as part of the drift well. For example, the drift well 230 may be referred to as an upper drift well while the HV device well 231 may be referred to as a lower drift well. The lower drift well facilitates in maintaining high voltage.

In one embodiment, both the drift well 230 and RESURF well 232 include at least one cut out region 260 under the drain region 250 and drain well 238. A cross-sectional view of the device with the cut out region is depicted in FIG. 2c (B-B') while a cross-sectional view of the device without the cut out region is depicted in FIG. 2b (A-A'). As shown in FIG. 2a, the drain region 250 is an elongated drain region along a second (y) direction. The y direction, for example, is along a channel width direction. The drain region is disposed within an opening of the ring shaped top field oxide 246. A cut out region, as shown in FIG. 2c, is disposed under the drain well 238 and is devoid of the drift well and RESURF well. For example, the cut out region includes the drain region 250 and drain well 238. However, there is no drift well or RESURF well in the cut out region. The cut out region, along the x direction, divides the drift well 230 and RESURF well 232 into first and second drift portions 229a-b. A drift portion is disposed under a leg of the ring shaped gate. A drift portion includes the drift well 230 over the RESURF well 232.

As discussed, the drift well includes at least one cut out region under the drain region along the channel width direction. For example, the drift well includes at least one cut out region 260, as depicted in FIG. 2c, and one non-cut out region, as depicted in FIG. 2b. In one embodiment, the cut out and non-cut out regions are distributed under the drain region along the y direction (channel width direction). In one embodiment, a plurality of cut out and non-cut out regions are distributed under the drain region along the y direction of the device region. The cut out and non-cut out regions may be alternating regions. Preferably, the cut out and non-cut out regions are uniformly distributed under the drain region along they direction of the device region. For example, the cut out and non-cut out regions are uniformly distributed along the width direction under the first S/D or drain region 250. Other configurations of the cut out and non-cut out regions may also be useful.

A cut out region 260 creates a resistance path between the drain region and substrate. The resistance path may be referred to as one resistance path created by a cut out region or collectively a plurality of resistance paths created by the cut out regions. The resistance path reduces the on resistance ($R_{sp}$) of the HV device. This improves the performance of the HV LDMOS device.

Metal silicide contacts (not shown) may be provided for various terminal or contact regions of the device. For example, metal silicide contacts may be provided for S/D regions, gate terminals and substrate contacts. The silicide contact may be a nickel-based silicide contact. For example, the silicide contact may be formed of nickel or nickel alloy.

A back-end-of-line (BEOL) dielectric (not shown) may be disposed on the substrate. For example, the BEOL dielectric covers the surface substrate, including HV and core transistors, as well as devices in other device regions. The BEOL dielectric may include a plurality of interlevel dielectric (ILD) levels. An ILD level includes a metal level dielectric over a contact level dielectric. The metal and contact level dielectrics may be silicon oxide. For example, the silicon oxide may be TEOS formed by chemical vapor deposition (CVD). Providing low k dielectrics for the metal and contact level dielectrics or a combination of low k and TEOS dielectrics may also be useful. The BEOL dielectric may include dielectric etch stop liners between ILD levels or between metal level and contact level dielectrics. Other configurations of BEOL dielectrics may also be useful.

Generally, a metal level dielectric includes conductors or metal lines while the contact level dielectric includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

As discussed, the BEOL dielectric includes a plurality of ILD levels. For example, x number of ILD levels may be provided. A device, for example, may include 6 ILD levels (x=6). Other numbers of ILD levels may also be useful. The numbers of ILD levels may depend on, for example, design requirement or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels. Interconnections to the devices of the various device regions on the substrate are provided by the conductors and contacts in the ILD levels of the BEOL dielectric.

Figure 3:
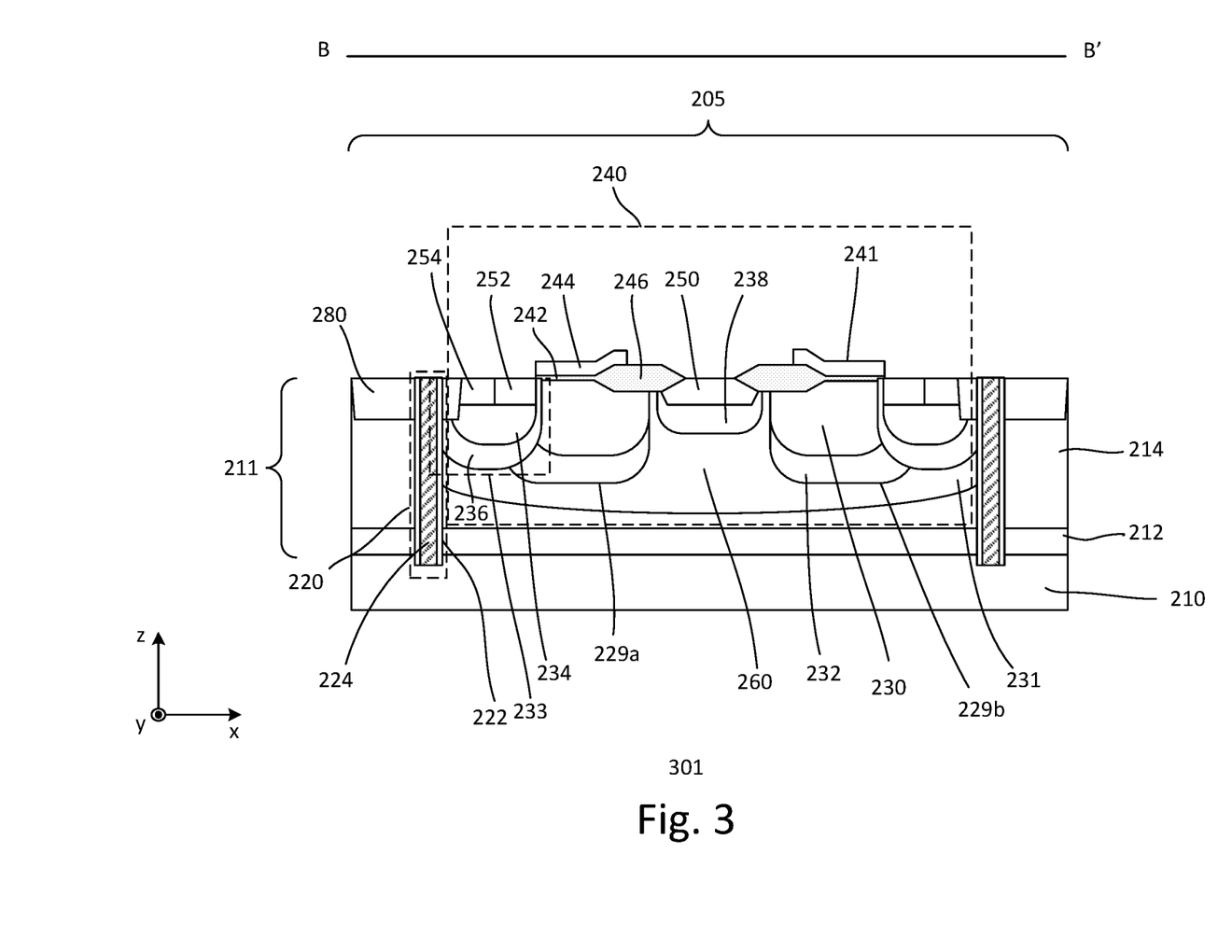
FIG. 3 shows a cross-sectional view of another embodiment of a device.

FIG. 3 shows a cross-section view of another embodiment of a HV device 301. The cross-sectional view, for example, is similar to the cross-sectional view of FIG. 2c. For example, the cross-sectional view illustrates a cut out region 260. The top view and cross-section view across a non-cut out region may be similar to FIGS. 2a-2b, except with the modifications according to FIG. 3. Common elements may not be described or described in detail.

As shown, a device region 205 on the substrate includes a HV LDMOS transistor 240. For example, the device region is disposed in an epi layer 211 on the substrate 210. The epi layer includes a buried isolation layer 212 to isolate the device region from the substrate. A device isolation region 280, such as a STI region, surrounds the device region. The device region includes a device well 231.

The HV transistor includes a source region 252 disposed in a ring shaped body well 231. The source region is a ring shaped source region and surrounds a ring shaped gate 241. The gate is disposed partially on a ring shaped top field oxide 246. The body well includes a ring shaped body tap 254 surrounding the source region. A drain region 250 of the transistor is disposed in the opening of the ring shaped field oxide. A drain well 238 is provided. The drain well encompasses the drain region. A drift well 230 is disposed in the device region under the gate. A RESURF well 232 is disposed under the drift well. The drift well abuts the body well. In one embodiment, both the drift well and RESURF well include at least one cut out region 260 disposed under the drain region and drain well. The cut out region is devoid of the drift well and RESURF well. For example, the cut out region separates the drift well and RESURF well into first and second portions 229*a-b*.

A deep trench isolation region 220, as shown, is disposed through the STI region and extends from the surface of the substrate to a depth below the bottom of the buried isolation layer. The deep trench isolation region, in one embodiment, surrounds the device region. The deep trench isolation may serve as a junction isolation as well as a tap to bias the substrate. In one embodiment, the deep trench isolation is disposed proximately to the device region to serve as a vertical plate. For example, the deep trench isolation region is disposed close to an inner edge of the STI region. In addition, the deep trench isolation region abuts the body well. In one embodiment, the deep trench isolation region abuts the lower body well 236.

By providing a polysilicon plate using the deep trench isolation region, the depletion boundary of the body well and the device well can be tailored to bend downwards instead of upwards. For example, the polysilicon plate causes the depletion boundary to curve downwards toward the buried isolation layer. This further improves breakdown voltage (BV) as well as reducing the $R_{sp}$ of the device, thereby further improving reliability and device performance. In addition, moving the deep trench isolation region closer to the device region reduces the size of the device region.

In other embodiments, the device includes a deep trench isolation region which is disposed sufficiently proximate to the device region to serve as a vertical polysilicon plate without cut out regions. For example, the deep trench isolation region is disposed close to an inner edge of the STI region. In one embodiment, the deep trench isolation region abuts the body well. In one embodiment, the deep trench isolation region abuts the lower body well. As for the drift region, it includes an upper drift well 230 and a lower drift well 231 with a RESURF well 232 therebetween. No cut out drift regions are provided in the drift region.

FIGS. 4*a*-4*e* show simplified cross-sectional views of an embodiment of a process 401 for forming a device. The device, for example, is similar to that described in FIGS. 2*a*-2*c* and FIG. 3. Common elements may not be described or described in detail.

Figure 4A:
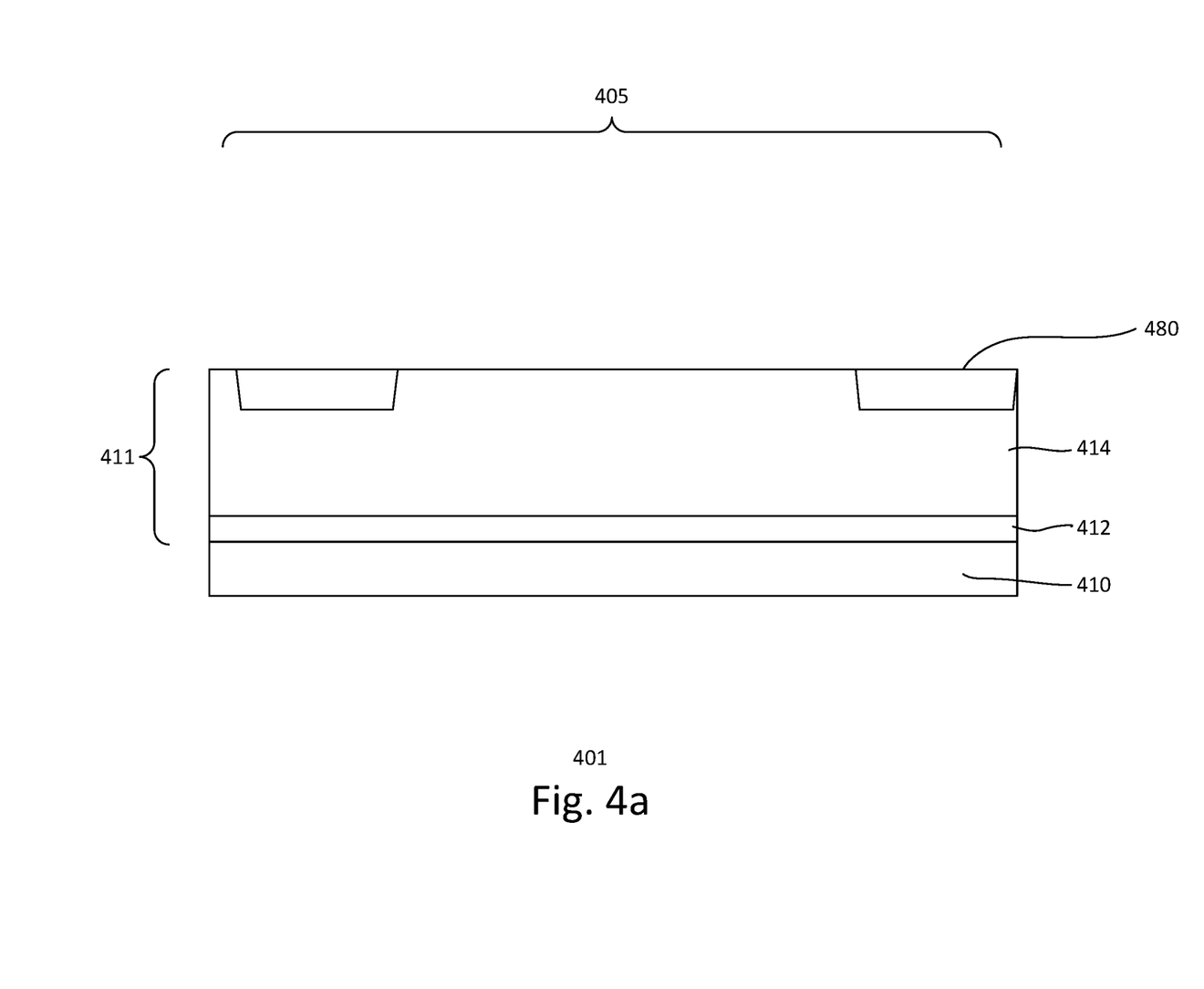
FIGS. 4a-4e show cross-sectional views of an embodiment of a process for forming a device.

Referring to FIG. 4*a*, a substrate 410 on which the device is formed is provided. The device, for example, is an IC. Other types of devices may also be useful. The substrate may be a silicon substrate. For example, the substrate may be a silicon wafer on which a plurality of devices are formed in parallel. Other suitable types of semiconductor substrates may also be useful. The substrate may be a doped substrate. For example, the substrate can be lightly doped with second polarity type dopants, such as a lightly doped p-type substrate. Providing a substrate with other types of dopants or dopant concentrations, as well as an undoped substrate, may also be useful.

In one embodiment, the substrate is processed to form an epi layer 411 on the substrate. For example, epitaxial growth is performed to form the epi layer. The epi layer, for example, is a silicon epitaxial layer grown on the surface of the substrate. The thickness of the epi layer may be about 10 µm. Forming an epi layer having other thicknesses may also be useful. The processing, in one embodiment, forms an epi layer with a buried isolation layer 412 and a surface device layer 414.

In one embodiment, the buried isolation layer 412 includes a doped buried isolation layer. The doped buried isolation layer, in one embodiment, includes a first polarity type heavily doped buried isolation layer. For example, the buried isolation layer is a n-type heavily doped buried isolation layer. The buried isolation layer serves to isolate the surface device layer from the substrate. For example, the $N^+$ buried layer isolates the upper portion of the epi layer from the p-type doped substrate. Doping the buried isolation layer may be achieved by in-situ doping or ion implantation. For example, in-situ doping is performed during epi growth up to the thickness of the buried isolation layer. Alternatively, ion implantation is performed after the epi layer has reached the thickness of the buried isolation layer. Doping the buried isolation layer by both in-situ doping and ion implantation may also be useful. In other embodiments, the substrate may be a bulk substrate with the buried isolation layer formed by ion implantation using, for example, an implant mask.

As for the surface device layer 414, it may be formed by continuing the epi growth. The surface device layer, for example, may be lightly doped with second polarity type dopants, such as p-type dopants. Doping the surface device layer with other dopant concentrations and/or n-type dopants may also be useful. The doping of the surface device layer may be achieved by in-situ doping and/or ion implantation.

The substrate is processed to define a device region 405. For example, the substrate is processed to define the HV device region. Defining the device region includes forming an isolation region 480 surrounding the device region. For example, the isolation region surrounds the surface device layer which serves as the device region. In one embodiment, the isolation region is a shallow trench isolation (STI) region. The STI region extends a depth of about 3-5 µm.

Various processes may be employed to form the STI region. For example, the substrate can be etched using etch and mask techniques to form an isolation trench. For example, a reticle is used to expose a soft mask layer, such as a photoresist. The pattern of the reticle is transferred to the soft mask layer after development. The mask is then used to etch the substrate by, for example, an anisotropic etch, such as a reactive ion etch. This forms the isolation trench which is then filled with dielectric materials such as silicon oxide. Chemical mechanical polishing (CMP) may be performed to remove excess oxide and provide a planar substrate top surface. The CMP completes forming the STI region. Other processes can also be used to form the STI region. Other types of isolation regions are also useful. The process may also include forming isolation regions for other types of device regions.

Figure 4B:
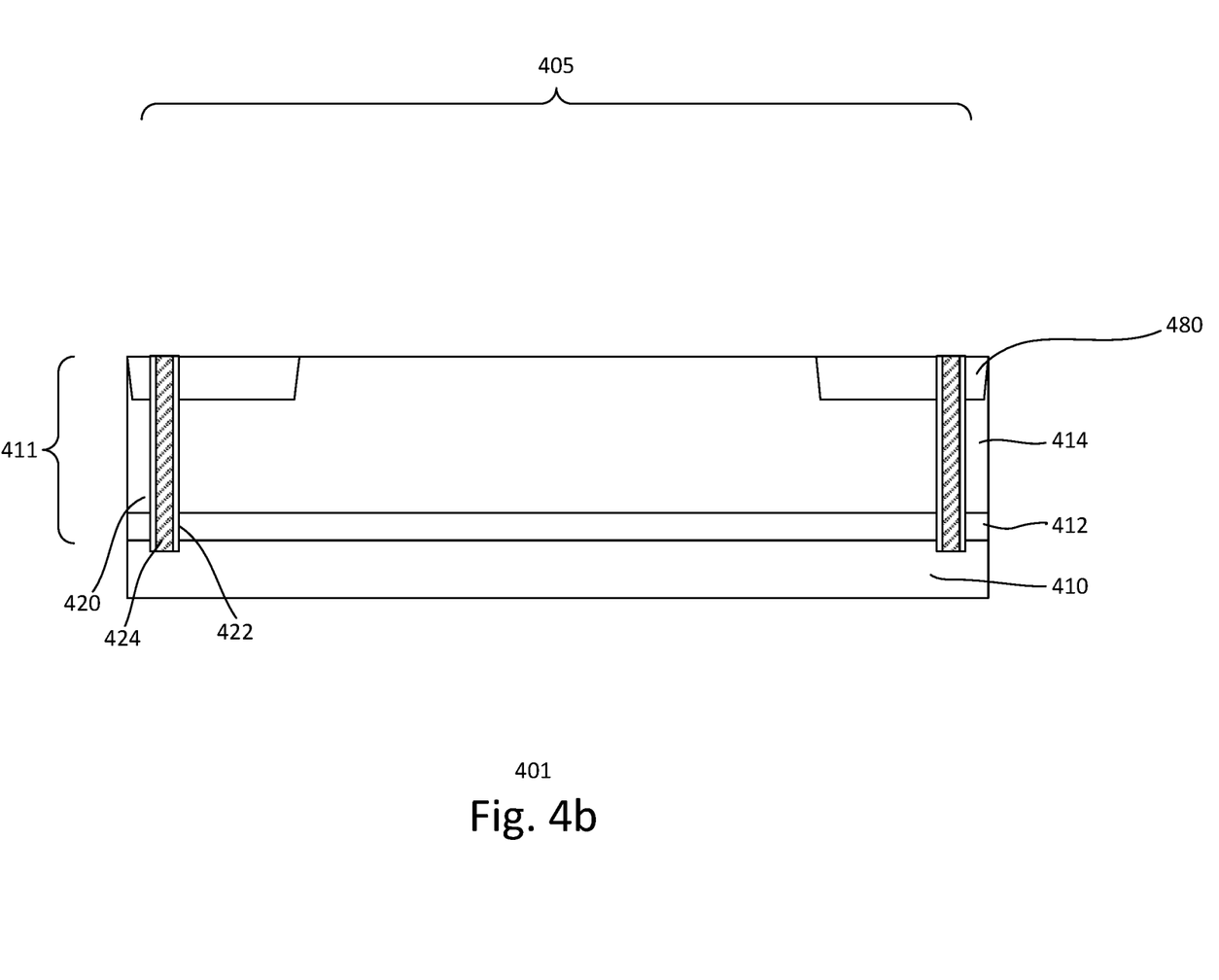

Referring to FIG. 4b, a deep trench isolation 420 is formed. The deep trench isolation, as shown, is formed through the STI region and extends from the surface of the substrate through the buried isolation layer and into the substrate below. The deep trench isolation region, in one embodiment, surrounds the device region. In some cases, a plurality of deep trench isolation regions may be distributed through around the device region to provide isolation between devices. The deep trench isolation may serve as a junction isolation. For example, the deep trench isolation improves junction isolation in the epi layer.

The deep trench isolation region, in one embodiment, includes a dielectric collar 422 lining the deep trench. The width of the deep trench may be about 1-3 µm. Providing other widths may also be useful. The dielectric collar, for example, is silicon oxide and is sufficiently thick to provide isolation. The trench, in one embodiment, is filled with polysilicon 424. The polysilicon fill may be a doped polysilicon fill. In one embodiment, the polysilicon fill is a doped polysilicon fill. The doped polysilicon fill may serve as a tap to the substrate below the buried isolation layer. For example, the deep trench is coupled to a bias voltage to bias the substrate. The bias voltage, for example, is ground. Other bias voltages may also be useful. In some cases, the deep trench isolation may also serve as a vertical plate. For example, the deep trench isolation is disposed more proximate to the device to serve as a vertical polysilicon plate. Other configurations of the deep trench or trenches may also be useful.

To form the deep trench isolation, a deep trench may be formed in the substrate. The deep trench, for example, may be formed in the epi layer and extends through the STI region into the substrate. The deep trench may be formed using mask and etch techniques. In one embodiment, a hard mask, such as silicon oxide and/or silicon nitride is formed on the substrate and patterned using a photoresist mask. The pattern of the photoresist mask is transferred to the hard mask. Using the hard mask, the substrate is etched to form the deep isolation trench. A dielectric layer, such as silicon oxide, may be deposited on the substrate, lining the surface of the substrate and the deep isolation trench. An etch, such as RIE, is performed to remove horizontal portions of the dielectric layer, leaving a dielectric collar lining sidewalls of the deep isolation trench. A polysilicon layer is deposited on the substrate, for example, by CVD. The dielectric layer may be doped by in-situ doping or ion implantation. Thereafter, the substrate is planarized by, for example, CMP, forming the deep trench isolation.

Figure 4C:
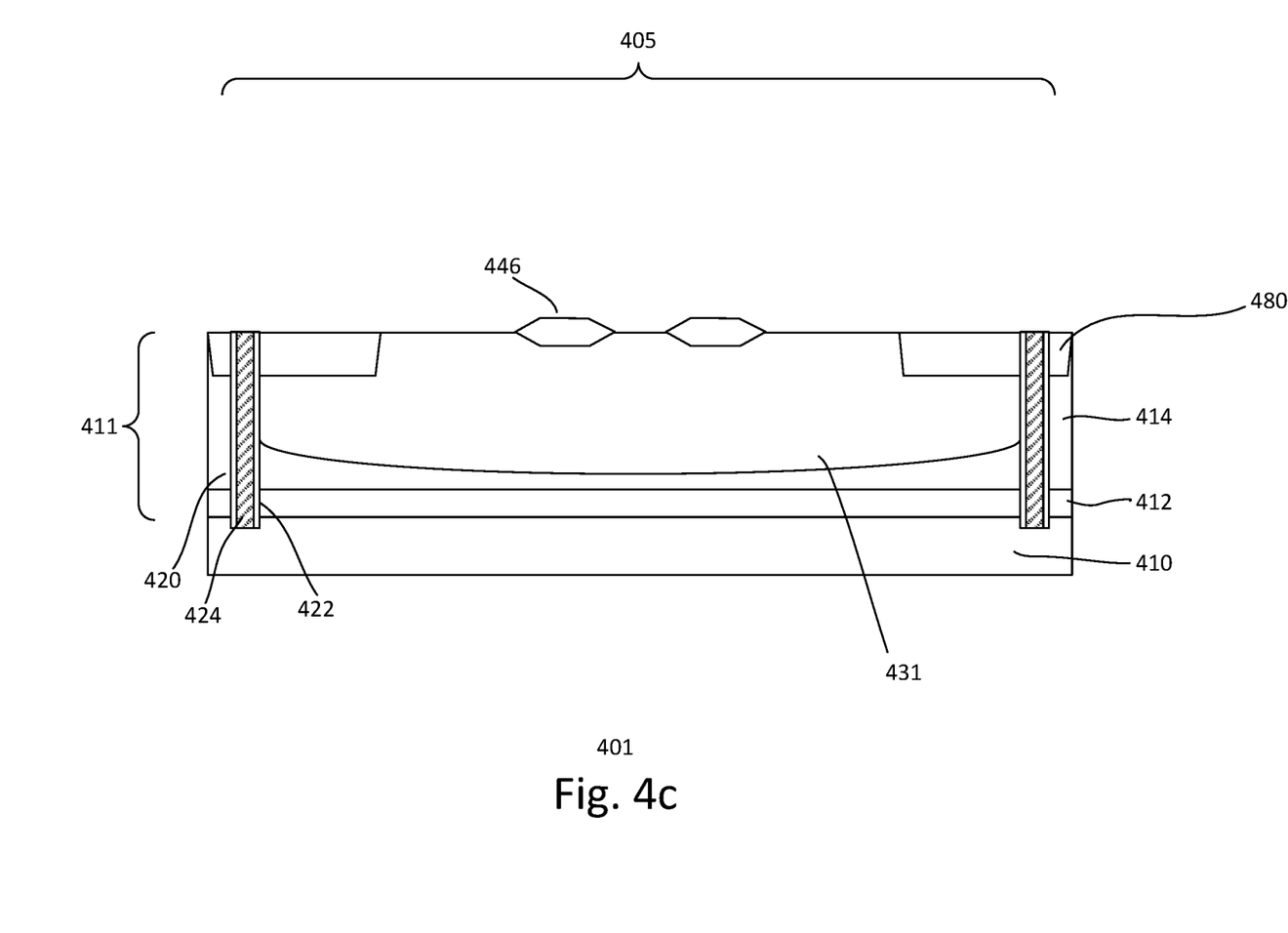

In FIG. 4c, a HV device well 431 is formed. The device well, in one embodiment, is a first polarity type deep device doped well for a first polarity type LD transistor. The dopant concentration of the HV device well may be about 1E16-1E17 dopants/cm$^3$. Other dopant concentrations may also be useful. The HV device doped well extends under the device isolation region and may have a depth of about 4-6 µm. Other depths may also be useful. The HV device well may serve as a lower drift well. To form the device well, an ion implantation process may be performed using an implant mask, such as a photoresist layer. The implant mask is patterned to expose the device region. Dopants are implanted into the substrate in the device region, forming the device well. In some cases, multiple implants may be performed to form the device well. For example, depending on the depth of the well, multiple implants may be employed. Forming the well in a single implant process may also be useful.

A top field oxide 446 is formed. The top field oxide, in one embodiment, is a ring shaped top field oxide. As shown, the top field oxide includes an elongated octagonal shape. Providing an octagonal shaped top field oxide avoids 90° angle, which reduces electric field buildup at the corners. The top field oxide, in one embodiment, is formed by thermal oxidation. For example, an oxidation mask is formed on the substrate. The oxidation mask may include a silicon nitride layer with a pad oxide below. The oxidation mask is patterned by mask and etch techniques, as previously described. The oxidation mask exposes the surface of the substrate where the top field oxide is to be formed. Thermal oxidation is performed to form the ring shaped top field oxide. After forming the top field oxide, the hard mask is removed. The hard mask may be removed by, for example, a wet etch selective to oxide. The thermal oxidation forms a top field oxide having a thickness of about 0.2-0.4 µm. Other thicknesses may also be useful.

Figure 4D:
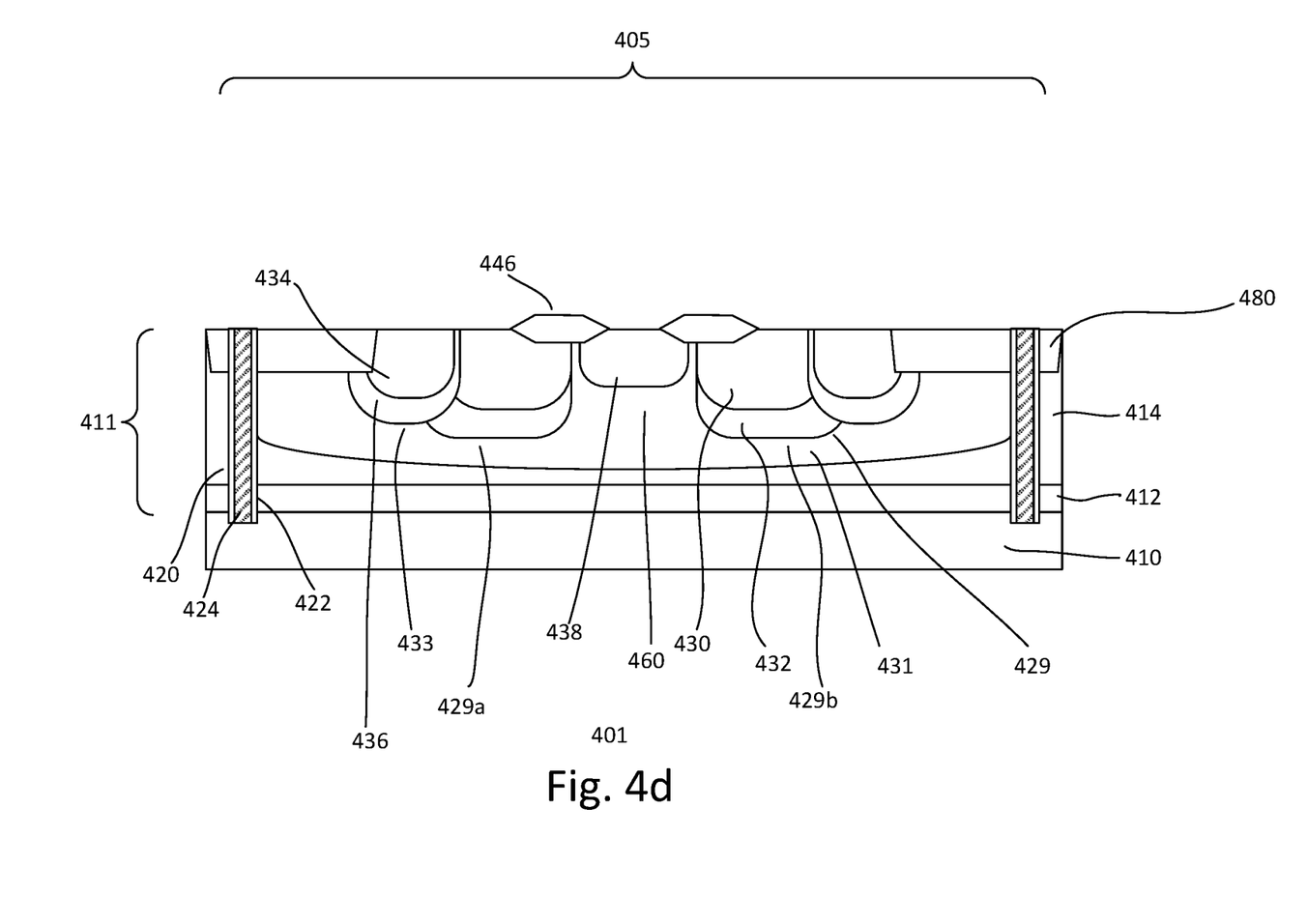

Referring to FIG. 4d, the process continues to form various wells of the HV device. As shown, a body well 433, a drift well 429 and a drain well 438 are formed in the substrate. The body well and drift well, for example, are formed in the epi layer within the device well.

In one embodiment, the body well includes a first body well 434 and a second body well 436. The first body well may be an intermediately doped second polarity type well. The dopant concentration, for example, may be about 1E18-1E19 dopants/cm$^3$. Other dopant concentrations may also be useful. The first body well extends from under the device isolation region to about an edge of a gate region. The gate region, for example, is a region on which a gate is subsequently formed. The gate, for example, may be configured for a ring shaped gate. Other types of gates may also be useful. The depth of the first body well may be about 2-3 µm. Providing the first body well having other depths may also be useful. The first body well, in one embodiment, is configured to accommodate a second S/D region and a body tap region.

As for the second body well, it is a second polarity type doped well and encompasses the first body well. The second body well extends from under the device isolation region to under the gate region. A depth of the second body well may be about 3-5 µm. Other depths may also be useful. The second body well may have a lighter dopant concentration than the first body well. For example, the second body well may be a lightly doped p-type well. The dopant concentration of the second body well may be about 1E16-1E17 dopants/cm$^3$. Other dopant concentrations may also be useful. Other configurations of the body wells may also be useful.

The drain well 438 is disposed adjacent to the top field oxide. In one embodiment, the drain well is disposed in the substrate under the opening of the ring shaped field oxide. The drain well, as shown, extends slightly under the top field oxide. The drain well is a first polarity type doped well. In one embodiment, the dopant concentration of the drain well is lighter than the drain region. For example, the drain well may be an intermediately doped first polarity type well. The dopant concentration of the drain well may be about 1E17-1E18 dopants/cm$^3$. Other dopant concentrations may also be useful. As shown, the drain well has a depth which is deeper than the device isolation region. For example, the depth of the drain well may be about 2-3 µm. Other depths for the drain well may also be useful.

The drift well, in one embodiment, includes an upper drift well 430 and a RESURF well 432. The upper drift well is a first polarity type doped well having a lighter dopant concentration than the drain well. For example, the drift well is a lightly doped first polarity type doped well. The dopant concentration of the upper drift well may be about 1E16-1E17 dopants/cm$^3$. Other dopant concentrations for the drift well may also be useful. In other embodiments, the drift well may have a graded dopant profile, with heavier dopant concentration at the top and lighter dopant concentration at the bottom. The drift well has a depth which is deeper than the drain well. The drift well may have a depth which is equal to about that of the first body well. The drift well is disposed under the gate and abuts the second body well.

As for the RESURF well, it is a second polarity type doped isolation well. The RESURF well is disposed under the upper drift well. The dopant concentration of the RESURF well may be about 1E16-1E17 dopants/cm$^3$. Other dopant concentrations for the RESURF well may also be useful.

In one embodiment, the drift well includes at least one cut out region 460 under the drain well. For example, the drift well includes at least one cut out region and one non-cut out region. The cut out and non-cut out regions are distributed in the drain region along the width direction of the device region. In one embodiment, the drift region includes a plurality of cut out and non-cut out regions. Preferably, the cut out and non-cut out regions are uniformly distributed in the drain region along the width direction of the device region. For example, the cut out and non-cut out regions are uniformly distributed along the width direction of the first S/D or drain region. Other configurations of cut out and non-cut out regions may also be useful. A cut out region, as shown, is devoid of the drift well. For example, the cut out region, along the channel length direction, divides the drift well into first and second drift portions 429*a-b*. A drift portion includes the upper drift well over the RESURF well. As for the non-cut out region, it includes the drift well and RESURF well under the drain well.

The various wells may be formed using separate implant processes. Similar wells may be formed using the same implant process. For example, wells with the same polarity type dopants, dopant concentrations and depths may be formed using the same implant process. In some cases, similarly located wells may be formed using separate implant processes using the same implant mask. For example, the first and second body wells may be formed by separate implant processes using the same implant mask. Providing angled implants may also be useful. Likewise, the upper and lower drift wells may be formed using separate implant processes with the same mask. Forming the body wells or drift wells in separate implant processes using different separate masks may also be useful. The drain well may be formed in a separate implant process using a drain well mask.

Typically, the deeper wells with lighter dopant concentrations are formed first. Shallower wells with heavier dopant concentrations are formed later. For example, the first and second body wells may be formed first, followed by the upper and lower drift wells. As for the drain well, it may be formed last. Other sequences for forming the wells may also be useful. In addition, some implants may employ multiple implant processes to create the desired depth and dopant profile.

Figure 4E:
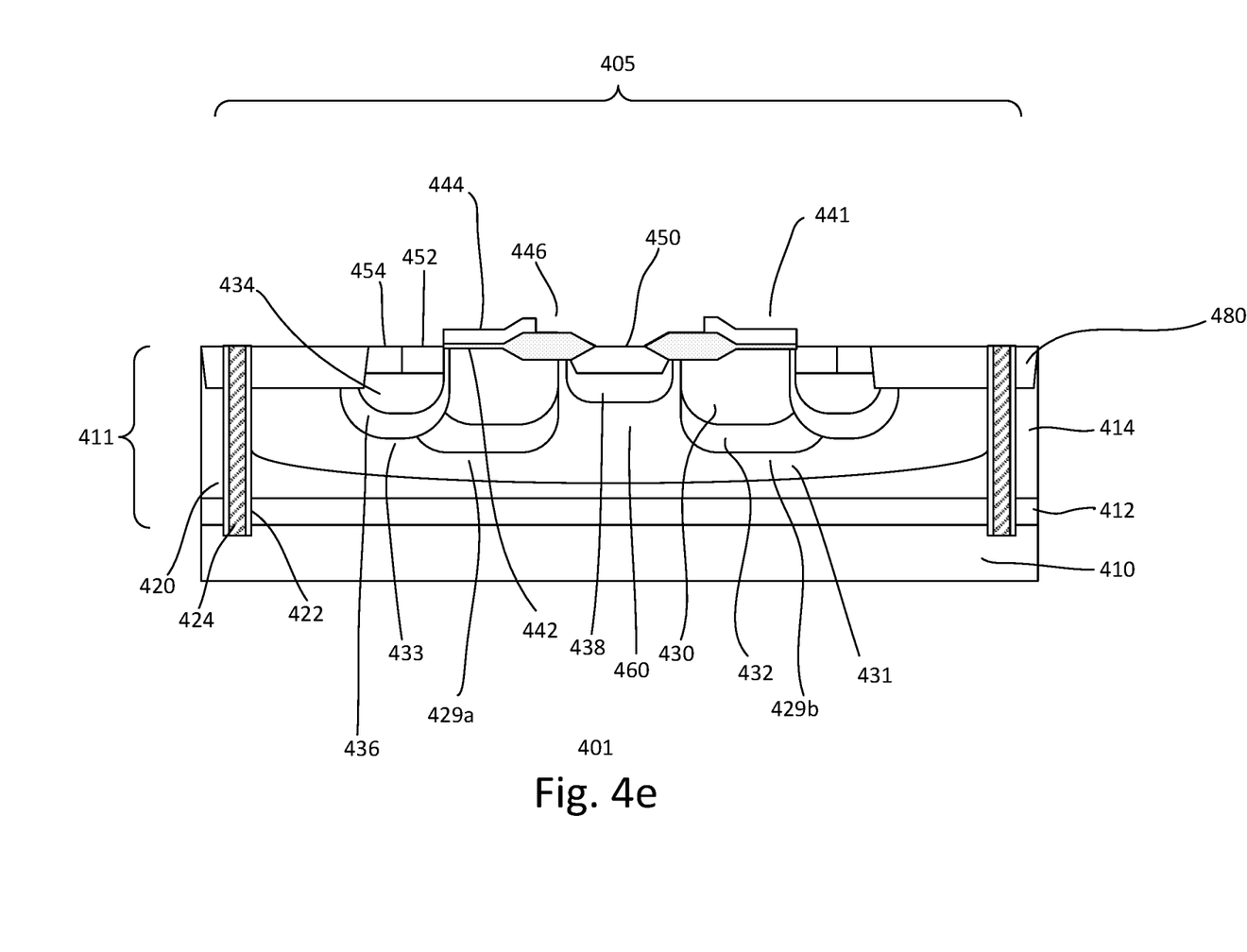

Referring to FIG. 4*e*, the process continues to form the transistor. In one embodiment, a gate 441 is formed. Forming the gate includes forming gate layers on the substrate. In one embodiment, the gate layers include a gate dielectric layer and a gate electrode layer. The gate dielectric may be a silicon oxide layer formed by thermal oxidation while the gate electrode may be a polysilicon layer formed by chemical vapor deposition (CVD). The electrode may be doped with first polarity type dopants. Doping the electrode may be achieved by ion implantation or by in-situ doping. The thickness of the gate dielectric layer may be about 100-300 Å and the thickness of the gate electrode layer may be about 0.1-0.2 μm. Other thicknesses may also be useful.

After the gate layers are formed on the substrate, they are patterned to form the gate. Patterning the gate layers is achieved using mask and etch techniques. For example, a patterned resist mask is provided from an anisotropic etch, such as a reactive ion etch (RIE). The etch removes exposed portions of the gate layers, leaving the gates in the gate region of the device region. Patterning the gate layers may also form gates in other device regions. The gate includes a gate electrode 444 over a gate dielectric 442. In one embodiment, the gate is a ring shaped gate and overlaps the top field oxide. For example, the gate includes a non-overlapping portion on the substrate and an overlapping portion disposed on the top field oxide. Patterning the gate layers exposes first and second S/D regions in the device region. In one embodiment, the body tap region is also exposed.

The process continues to form S/D regions and a body tap. In one embodiment, lightly doped extension regions are formed in the S/D regions of the transistors. The lightly doped extension regions, for example, are lightly doped first polarity regions. To form lightly doped extension regions, an implant mask exposing the S/D regions is used for a lightly doped first polarity type implant. The implant implants first polarity type dopants to form the lightly doped extension regions in the S/D regions. The lightly doped extension regions, for example, are aligned with sidewalls of the gates. The lightly doped extension regions may extend slightly under the gates. A lightly doped extension region may also be provided for the first S/D region of the HV transistor. The implant may also form lightly doped extensions for other first polarity type transistors and contact regions. A second polarity type lightly doped implant may be performed to form second polarity type lightly doped extensions for second polarity type transistors and contact regions.

After forming the lightly doped extension regions, gate sidewall spacers may be formed. For example, sidewall spacers are formed on first and second sidewalls of the gate. In one embodiment, forming the sidewall spacers includes forming a first and second spacer layers on the substrate. The first spacer layer may be a silicon oxide layer formed by CVD and the second spacer layer may be a silicon nitride layer formed by CVD. An anisotropic etch, such as RIE, is performed. The etch removes horizontal portions of the spacer layers, leaving sidewall spacers on the gate sidewalls.

First polarity type S/D regions are formed on the substrate in the device region. The first polarity type S/D regions are heavily doped regions. For example, first and second S/D regions 450 and 452 are formed in the device region. The second S/D region is a ring shaped S/D region. The second S/D region, for example, is displaced from the second gate sidewall by the gate sidewall spacer. As for the first HV S/D region, it is displaced from the gate by the field oxide. However, the drift well provides a connection for the first S/D region to the body well and gate. Forming the S/D regions is achieved by an implant using an implant mask. For example, the implant exposes the S/D regions, enabling the implant to implant first polarity type dopants to form the first polarity type S/D regions. The implant may also form first polarity type S/D regions and contact regions in other device regions.

A heavily doped second polarity type body tap or contact 454 is formed in the device region. As shown, the body tap is formed adjacent to the second S/D region. The body tap may be a ring shaped body tap. An implant using a body tap implant mask may be performed to form the second polarity type body tap in the device region. The implant may also be used to form second polarity type S/D regions for second polarity type transistors and other second polarity type contacts in other device regions.

The process may continue to form metal silicide contacts on various terminals of the transistors and substrate contacts in the device regions. For example, metal silicide contacts may be provided for S/D regions, gate terminals and body tap. The metal silicide contact may be a nickel-based silicide contact. For example, the silicide contact may be formed of nickel or nickel alloy. To form metal silicide contacts, a metal layer is formed over the substrate and annealed to cause a reaction with the metal and exposed silicon surfaces. The reaction forms a metal silicide. Excess unreacted metal is removed by, for example, a wet etch.

The process may continue to form the device. For example, back-end-of-line (BEOL) processes may be performed to form BEOL dielectric with a plurality of ILD levels, as previously discussed, to form interconnections to the terminals of the memory cell. Additional processes are performed to complete the IC. These processes include, for example, final passivation, dicing and packaging. Other processes may also be included.

Furthermore, it is understood that the process of FIGS. 4a-4e can be modified to form the device as described in FIG. 3. For example, the mask used to form the deep trench isolation may be modified to be situated closer to the body well. In addition, the process may be modified to form a device without cut out regions.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
    a substrate with a device region;
    a transistor in the device region, wherein the transistor includes a gate on the substrate and having first and second gate sidewalls, a first source/drain (S/D) region disposed adjacent to the first gate sidewall, and a second source/drain (S/D) region disposed adjacent to the second gate sidewall;
    a drain well disposed below and encompassing the first S/D region;
    a body well disposed in the device region, wherein the body well encompasses the second S/D region and extends under a portion of the gate beyond the second gate sidewall; and
    a drift well disposed in the substrate, wherein the drift well comprises:
        a non-cut out region disposed under a first portion of the first S/D region and the drain well, the non-cut out region extending under the gate to the body well and coupling the first portion of the first S/D region to the body well, the non-cut out region completely encompassing the first portion of the first S/D region, and
        a cut out region disposed under a second portion of the first S/D region and the drain well, the cut out region devoid of the drift well, and the cut out region structured to reduce an on resistance of the transistor.

2. The device of claim 1 further comprising:
    a top field oxide disposed on the substrate in the device region,
    wherein the gate includes a non-overlapping portion with the second gate sidewall disposed on the substrate and an overlapping portion with the first gate sidewall disposed on the top field oxide, and the first S/D region is displaced from the gate by the top field oxide.

3. The device of claim 1 further comprising:
    a second non-cut out region distributed with the first non-cut out region along a width direction of the first S/D region; and
    a second cut out region distributed with the first cut out region along the width direction of the first S/D region.

4. The device of claim 1 further comprising:
    a reduced surface field (RESURF) well disposed below the drift well; and
    a device well disposed in the device region,
    wherein the device well encompasses the drift well and the RESURF well, the non-cut out region is disposed under the first portion of the first S/D region and the drain well includes the drift well and the RESURF well, the cut out region is disposed under the second portion of the first S/D region and the drain well, and the cut out region is devoid of the drift well and the RESURF well.

5. The device of claim 1 further comprising:
    a device well encompassing the drift well and the body well;
    a buried isolation layer disposed in the substrate below the device region; and
    a deep trench isolation region surrounding the device region,
    wherein the deep trench isolation region extends from a top surface of the substrate through the buried isolation layer to the substrate below, and the deep trench isolation region is configured to serve as a vertical plate to reduce the on resistance.

6. The device of claim 5 wherein the deep trench isolation region comprises:
    an isolation collar lining deep trench sidewalls of a deep trench in which the deep trench isolation region is disposed; and
    a polysilicon fill in the deep trench isolation region, wherein the polysilicon fill is isolated from the deep trench sidewalls by the isolation collar.

7. The device of claim 1 further comprising:
    a device isolation region surrounding the device region.

8. The device of claim 1 wherein the body well comprises:
    an upper body well encompassing the second S/D region; and
    a lower body well encompassing the upper body well.

9. The device of claim 1 further comprising:
    an epitaxial layer formed on the substrate,
    wherein the epitaxial layer serves as a surface substrate for the device region.

10. The device of claim 1 further comprising:
    a body contact region disposed in the substrate,
    wherein the body contact region and the second S/D region are commonly coupled.

11. The device of claim 1 further comprising:
    a ring-shaped top field oxide disposed on the substrate in the device region, wherein the gate comprises a ring-shaped gate having inner and outer gate sidewalls, the inner gate sidewall serves as the first gate sidewall and the outer gate sidewall serves as the second gate sidewall, the ring-shaped gate includes a non-overlapping portion with the outer gate sidewall disposed on the substrate and an overlapping portion with the inner gate sidewall disposed on the top field oxide;

the first S/D region is disposed in the substrate within the opening of the ring-shaped top field oxide and displaced from the gate by the top field oxide;

the second S/D region comprises a ring-shaped second S/D region disposed in the substrate adjacent to the outer gate sidewall; and the body well comprises a ring-shaped body well disposed in the device region, and the body well encompasses the second S/D region and extends under a portion of the gate beyond the outer gate sidewall.

12. The device of claim 1 wherein the cut out region creates a resistance path in the second portion of the first S/D region and the substrate to reduce the on resistance of the transistor.

13. A device comprising:
a substrate with a device region;
a transistor in the device region, wherein the transistor includes a gate on the substrate and having first and second gate sidewalls, a first source/drain (S/D) region disposed adjacent to the first gate sidewall, and a second S/D region disposed adjacent to the second gate sidewall;
a body well disposed in the device region, wherein the body well encompasses the second S/D region and extends under a portion of the gate beyond the second gate sidewall;
a drift well disposed in the substrate, wherein the drift well comprises a non-cut out region disposed under a first portion of the first S/D region and a cut out region disposed under a second portion of the first S/D region, the non-cut out region extends under the gate to the body well and couples the first portion of the first S/D region to the body well, the cut out region is devoid of the drift well, and the cut out region is structured to reduce an on resistance of the transistor;
a reduced surface field (RESURF) well disposed below the drift well; and
a device well disposed in the device region, wherein the device well encompasses the drift well and RESURF well,
wherein the non-cut out region is disposed under the first portion of the first S/D region includes the drift well and the RESURF well, and the cut out region is disposed under the second portion of the first S/D region and is devoid of the drift well and the RESURF well.

14. A device comprising:
a substrate with a device region;
a transistor in the device region, wherein the transistor includes a gate disposed on the substrate and having first and second gate sidewalls, a first source/drain (S/D) region disposed adjacent to the first gate sidewall, and a second source/drain (S/D) region disposed adjacent to the second gate sidewall;
a body well disposed in the device region, wherein the body well encompasses the second S/D region and extends under a portion of the gate beyond the second gate sidewall;
a drift well disposed in the substrate, wherein the drift well comprises:
a non-cut out region disposed under a first portion of the first S/D region, the non-cut out region extending under the gate to the body well and coupling the first portion of the first S/D region to the body well, and the non-cut out region completely encompassing the first portion of the first S/D region, and
a cut out region disposed under a second portion of the first S/D region, the cut out region devoid of the drift well;
a device well encompassing the drift well and body well; and
a deep trench isolation region surrounding the device region, wherein the deep trench isolation region extends from a surface of the substrate to a depth in the substrate below the device well, and the deep trench isolation region is configured to serve as a vertical plate to reduce an on resistance.

15. A method for forming a device comprising: providing a substrate with a device region;
forming a transistor in the device region, wherein the transistor comprises a gate on the substrate and having first and second gate sidewalls, a first source/drain (S/D) region disposed adjacent to the first gate sidewall and a second source/drain (S/D) region disposed adjacent to the second gate sidewall:
forming a drain well disposed below and encompassing the first S/D region;
forming a body well in the device region, wherein the body well encompasses the second S/D region and extends under a portion of the gate beyond the second gate sidewall; and
forming a drift well in the substrate, wherein the drift well comprises a non-cut out region and a cut out region, the non-cut out region includes a portion of the drift well, the cut out region is devoid of the drift well, the non-cut out region is disposed under a first portion of the first S/D region and the drain well, and the cut out region is disposed under a second portion of the first S/D region and the drain well,
wherein the second S/D region is disposed within the body well, the non-cut out region of the drift well completely encompasses the first portion of the first S/D region, the non-cut out region extends under the gate to the body well and couples the first portion of the first S/D region to the body well, and the cut out region of the drift well is structured to reduce an on resistance of the transistor.

16. The method of claim 15 further comprising:
forming a buried isolation layer to isolate the device region from the substrate below; and
forming a deep trench isolation region surrounding the device region,
wherein the deep trench isolation region extends from a surface of the substrate through the buried isolation layer to the substrate below, and the deep trench isolation region is configured to serve as a vertical plate to reduce the on resistance.

* * * * *